(12) United States Patent
Zhu

(10) Patent No.: US 7,201,937 B2
(45) Date of Patent: Apr. 10, 2007

(54) METHODS FOR FORMING COMPOSITE COATINGS ON MEMS DEVICES

(75) Inventor: Xiaoyang Zhu, Maple Grove, MN (US)

(73) Assignee: MicroSurfaces, Inc., Minneapolis, MN (US)

( * ) Notice: Subject to any disclaimer, the term of this patent is extended or adjusted under 35 U.S.C. 154(b) by 161 days.

(21) Appl. No.: 10/641,547

(22) Filed: Aug. 15, 2003

(65) Prior Publication Data
US 2005/0037135 A1    Feb. 17, 2005

(51) Int. Cl.
*B05D 5/12* (2006.01)
*B05D 3/02* (2006.01)
*C23C 16/00* (2006.01)

(52) U.S. Cl. ............ 427/58; 427/255.18; 427/255.27; 427/25.393; 427/255.7; 427/387

(58) Field of Classification Search .............. 427/58, 427/387, 255.18, 255.27, 255.393, 255.7
See application file for complete search history.

(56) References Cited

U.S. PATENT DOCUMENTS

| | | | |
|---|---|---|---|
| 4,781,942 A * | 11/1988 | Leyden et al. | 427/509 |
| 5,403,665 A | 4/1995 | Alley et al. | |
| 6,576,489 B2 * | 6/2003 | Leung et al. | 438/52 |
| 6,674,140 B2 * | 1/2004 | Martin | 257/415 |
| 2004/0012061 A1 * | 1/2004 | Reid et al. | 257/415 |
| 2004/0037956 A1 * | 2/2004 | Yang | 427/248.1 |
| 2004/0071863 A1 * | 4/2004 | Zhu et al. | 427/58 |

FOREIGN PATENT DOCUMENTS

WO    WO 01/57920    8/2001

OTHER PUBLICATIONS

Genzer, Jan, Efimenko, Kirill, and Fischer, Daniel A. "Molecular Orientation and Grafting Density in Semifluorinated Self-Assembled Monolayers of Mono-, Di-, and Trichioro Silanes on Silica Substrates." *Langmuir* 2002, 18: 9307-9311.
Kushmerick, J.G., Hankins, M.G., De Boer, M.P., Clews, P.J. Carpick, R.W., and Bunker, B.C. "The influence of coating structure on micromachine stiction." *Tribology Letters* (2001) vol. 10, No. 1-2: 103-108.
De Boer, M.P., Knapp, J.A., Michalske, T.A., Srinivasan, U., and Maboudian, R. "Adhesion Hysteresis Of Silane Coated Microcantilevers." *Acta mater.* 48 (2000): 4531-4541.
Bunker, B.C., Carpick, R.W., Assink, R.A., Thomas, M.L., Hankins, M.G., Voigt, J.A., Sipola, D., De Boer, M.P., and Gulley, G.L. "The Impact of Solution Agglomeration on the Deposition of Self-Assembled Monolayers." *Langmuir* 2000, 16:7742-7751.
Fadeev, Alexander Y. and McCarthy, Thomas J. "Self-Assembly Is Not The Only Reaction Possible between Alkyltrichlorosilanes and Surfaces: Monomolecular and Oligomeric Covalently Attached Layers of Dichloro- and Trichloroalkylsilanes on Silicon." *Langmuire* 2000, 16: 7268-7274.
Maboudian, Roya. "Surface processes in MEMS technology." *Surface Science Reports* 30 (1998) 207-269.

* cited by examiner

*Primary Examiner*—Brian K. Talbot
(74) *Attorney, Agent, or Firm*—Dorsey & Whitney LLP; Scott D. Rothenberger

(57) ABSTRACT

The present invention provides unique methods of coating and novel coatings for MEMS devices. In general a two step process includes the coating of a first silane onto a substrate surface followed by a second treatment with or without a second silane and elevated temperatures.

8 Claims, 3 Drawing Sheets

METHODS FOR FORMING COMPOSITE COATINGS ON MEMS DEVICES

STATEMENT OF GOVERNMENT RIGHTS

This work was supported in part by Sandia National Laboratory under contract number BE-7471. The government may have certain rights in the invention.

BACKGROUND OF THE INVENTION

Micro-electro-mechanical system devices (MEMS) are usually made from inorganic materials using semiconductor technologies. Examples of commonly used inorganic material for MEMS devices include silicon, silicon oxide, silicon nitride, and aluminum. These inorganic materials possess high surface energy. As a result, the surfaces often stick together when they come into contact. This problem is particularly significant because the surface-area to volume ratio scales with the inverse of device dimension and this ratio is very large for MEMS devices with typical dimensions on the micrometer scale.

A well-known surface related problem in the fabrication and operation of MEMS devices is stiction, which occurs when the surface adhesion force overcomes the mechanical restoring force of microstructures. Stiction is one of the leading causes of device failure in the MEMS industry. One example of a MEMS device currently in commercial use is the digital mirror device (DMD) of Texas Instruments. The DMD consists of ~1,000,000 micro-mirrors. During operation, each mirror is rotated ±10° to reflect light from a source to the screen; this rotation brings the mirror assembly (specifically, the tip of the yoke on which the mirror is mounted) into contact with the substrate and stiction can occur. Another example of a commercial product utilizing MEMS technology is the airbag sensor of Analog Devices. The airbag sensor, also called accelerometer, consists of a movable component which responses to changes in inertial during collision. However, the movable component may become stuck to other fixed component in its immediate environment resulting in device failure.

One approach to solve the stiction problem has been to apply a passivation, organic coating to the surfaces of MEMS devices. Organic coatings consisting of hydrocarbon or fluorocarbons are generally characterized by low surface energy. When surfaces with such low energy coatings come into contact, the adhesion energy is substantially reduced as compared to the uncoated, inorganic surfaces. The lowering of surface energy helps to alleviate the stiction problem.

Another approach to apply a passivating coating onto a MEMS devices involves the introduction of an organic material, phenyl-siloxane in particular. Still another approach has been to utilize a combination of an organic material and moisture with a MEMS device in a sealed package and heating the package to a high temperature to form a passivation coating on the surface of the MEMS device. This type of coating has been applied to accelerometers (airbag sensors) where contacts between different components on a MEMS device are infrequent. Thus emphasis of this method has been on thermal stability of the coating to be compatible with packaging temperature, rather than achieving the lowest possible surface energy or the highest mechanic stability.

Therefore, there remains a need in the art for improved methods and coatings applicable to a MEMS device that provide for robust coatings and the reduction or, preferably, elimination of stiction.

BRIEF SUMMARY OF THE INVENTION

This present invention provides methods of coating and coatings to modify surfaces of micro-electro-mechanical system (MEMS) devices. MEMS devices are sometimes referred to as micro-opto-electro-mechanical systems (MOEMS), micro-machines, micro-machined sensors and actuators, or microsystems, all of which are included within the scope of this invention. More particularly, the invention deals with forming robust and low energy surface coatings on MEMS devices.

In one aspect, the present invention provides methods for the formation of organic coatings, particularly low-energy coatings, on MEMS devices. Preferably, the methods can be used to form composite coatings, each consisting of at least two types of regions. A first region where the adsorbed molecules to the MEMS surface are extensively cross-linked (oligomeric or polymeric) and a second region, where each adsorbed molecule is covalently bonded to the surface. More particularly, the coatings are of monolayer nature. Such coatings are most desirable as anti-stiction coatings in MEMS devices where frequent mechanical contacts are required during operation.

The present invention focuses on treating a surface of a MEMS device with a coating material or materials in one or two reactive components. In either case, the coated MEMS device is subjected to heat to help facilitate the desired anti-stiction properties. For example, the MEMS device is treated with either $SiX_3R$ and/or $SiX_2R_2$ (in gaseous form or as a solution) and then subjected to a heat treatment. In one aspect, $SiX_3R$ (gaseous or in solution) is coated onto the MEMS device and then subjected to elevated temperatures in the presence of $SiXR_3''$ (gaseous or in solution). In another aspect, $SiX_2R_2$ (gaseous or as a solution) is coated onto the MEMS device and then subjected to elevated temperatures in the presence of $SiXR_3''$ (gaseous or in solution). Alternatively, both $SiX_3R$ and $SiX_2R_2$ (gaseous or in solution) are coated onto the MEMS device and then subjected to elevated temperatures in the presence of $SiXR_3''$ (gaseous or in solution). The resultant coating can be a thin film or a self-assembled monolayer (SAM).

In one embodiment, the present invention provides methods for application of a composite coating to the surface of a MEMS device in two steps. First, a self assembled monolayer is formed from $SiX_3R$ (gaseous or in solution), wherein R is an organic group, e.g., R is a linear or branched, substituted or unsubstituted alkyl or aryl group, and each X, individually, is Cl or OR', wherein R' is an alkyl group (e.g., $CH_3-$ or $C_2H_5-$). A suitable example of $SiX_3R$ is 1H,1H, 2H,2H-perfluorooctyl trimethoxysilane (PFOTMS), i.e., $CF_3(CF_2)_5CH_2CH_2Si(OCH_3)_3$.

In a second step, the surface is exposed at elevated temperatures to $SiXR''_3$ (gaseous or in solution) wherein each R'' is independently an organic group (R'' is a linear or branched, substituted or unsubstituted alkyl or aryl group) and X is Cl, H, or OR' and R' is an alkyl group (e.g., $CH_3-$ or $C_2H_5-$). A suitable example of $SiXR''_3$ is 1H,1H,2H, 2H-perfluorooctyl dimethyl methoxysilane (PFODMMS), $CF_3(CF_2)_5CH_2CH_2Si(CH_3)_2OCH_3$.

In another embodiment, the present invention provides for application of a composite coating to the surface of a MEMS device in a two step process. First, a coating is formed from $SiX_3R$ (gaseous or in solution), wherein R is an organic group (R is a linear or branched, substituted or unsubstituted alkyl or aryl group) and each X, independently of each other, is Cl or OR', and R' is an alkyl group (e.g., $CH_3-$ or $C_2H_5$—). In a second step, the surface is heated to elevated temperatures to enable formation of cross-linked and surface attached regions.

In still another embodiment, the present invention provides for application of a composite coating to the surface of a MEMS device in a two step process. First, an oligomeric or polymeric thin film is formed from $SiX_3R$ or $SiX_2R_2$ (gaseous or in solution), wherein each R, independently, is an organic group (e.g., R is a linear or branched, substituted or unsubstituted alkyl or aryl group) and each X, independently, is Cl or OR' and R' is an alkyl group (e.g., $CH_3$— or $C_2H_5$—). In a second step, the surface is exposed at elevated temperatures to $SiXR''_3$ (gaseous or in solution) wherein each R'' is independently an organic group (e.g., R'' is a linear or branched, substituted or unsubstituted alkyl or aryl group) and X is Cl, H, or OR'.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION

Figure 1:
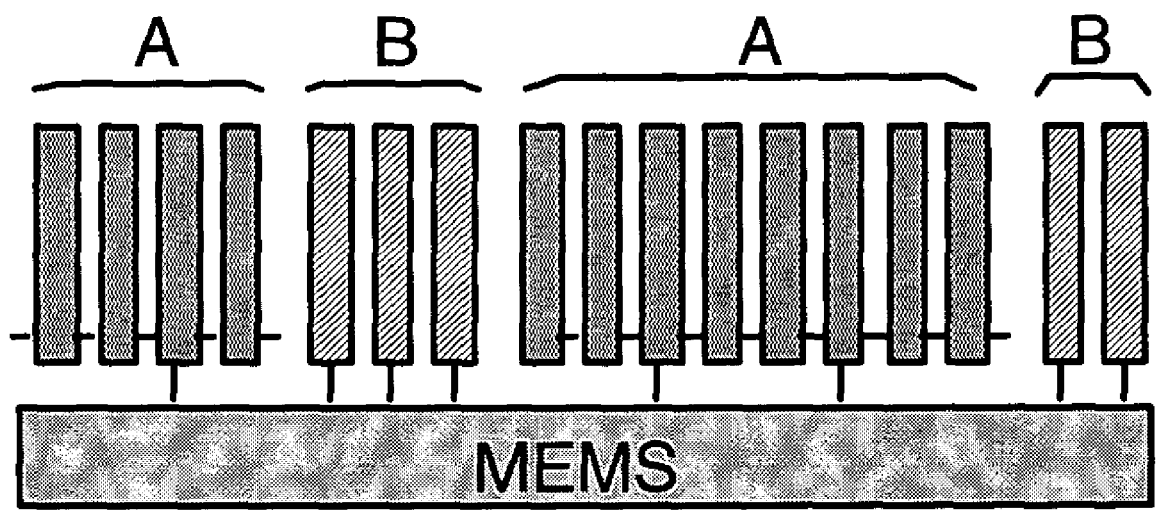
FIG. 1 is a schematic illustration of a composite monolayer prepared by a method of the invention and consists of regions (A) where molecules are extensively cross-linked with a small number of anchoring bonds to the surface, and regions (B) where each molecule is individually anchored to the surface.

The present invention provides methods for the formation of organic coatings on MEMS devices. In one aspect, the methods can be used to form composite coatings. A composite coating is defined as one which consists of at least two types of regions: those where the adsorbed molecules are extensively cross-linked (oligomeric or polymeric) and those where each adsorbed molecule is covalently bonded to the surface. Oligomeric is defined as involving less than 10 cross-linked bonds and polymeric is defined as involving more than 10 cross linked bonds.

In another aspect of the invention, the coatings provided by the methods of the invention are monolayer films having substantially molecular thickness. The molecules forming the monolayer are chemically and thermally stable at room temperature (with vaporization temperatures preferably above room temperature, and more particularly below 400° C.), and are soluble in an organic solvent such as iso-octane in an amount of at least about $1 \times 10^{-6}$ mole/liter.

The composite coatings possess low energy surface characteristics. In this context, "low energy" means that the water contact angle of the surface is 90 degrees or larger. Such coatings also form passivation layers. In this context, a "passivation layer" is one that possesses generally low chemical reactivity towards the adsorption of or reaction with chemical species in ambient conditions and within a packaged environment. Thus, the coatings provided by the methods of the present invention are mechanically stable and can withstand more than $10^9$ cycles of contacts, such as the operation of a DMD, without stiction. These coatings provided by the methods of the invention are thermally stable at temperatures as high as 200° C., and more preferable up to 400° C., for example.

The surfaces of various materials used in MEMS devices can be modified according to the present invention. These materials include metals, semiconductors, as well as various chemical variants of metals and semiconductors, such as alloys, oxides, nitrides, carbides, ceramics, and combinations thereof. More specifically, the materials include silicon, silicon oxide, silicon nitride, aluminum, aluminum alloys, aluminum oxide, aluminum nitride.

Each silane monomer (organic precusor) used in the coating processes of the invention contains two major portions: a functional group to provide low surface energy (e.g., a hydrocarbon or fluorocarbon group to provide "wax-like" or "Teflon-like" surfaces); and a second reactive group.

Suitable hydrocarbon groups include substituted and unsubstituted, branched and linear alkyl groups having from about 1 to about 20 carbon atoms. The term "alkyl" refers to the radical of saturated aliphatic groups, including straight-chain alkyl groups, branched-chain alkyl groups, cycloalkyl (alicyclic) groups, alkyl substituted cycloalkyl groups, and cycloalkyl substituted alkyl groups. In particular, cycloalkyls have from about 4–10 carbon atoms in their ring structure, and more particularly have 5, 6 or 7 carbons in the ring structure.

In another embodiment, hydrocarbon portion of the organic precursor could be an aryl group. The term "aryl" as used herein includes 5- and 6-membered single-ring aromatic groups that can include from zero to four heteroatoms, for example, benzene, pyrrole, furan, thiophene, imidazole, oxazole, thiazole, triazole, pyrazole, pyridine, pyrazine, pyridazine and pyrimidine, and the like. Aryl groups also include polycyclic fused aromatic groups such as naphthyl, quinolyl, indolyl, and the like. Those aryl groups having heteroatoms in the ring structure may also be referred to as "aryl heterocycles", "heteroaryls" or "heteroaromatics". Aryl groups can also be fused or bridged with alicyclic or heterocyclic rings, which are not aromatic so as to form a polycycle (e.g., tetralin). The aromatic ring can be substituted at one or more ring positions with substituents that are hydrophobic in nature as described below.

Substituents suitable for substitution on the aryl group or alkyl group, are for example, halogen, alkoxy, alkylcarbonyloxy, arylcarbonyloxy, alkoxycarbonyloxy, aryloxycarbonyloxy, perfluoroalkyl, trifluoromethyl, aralkyl, or an aromatic or heteroaromatic moiety.

In particular, fluorocarbon groups are within the scope of the invention and are included as both alkyl type groups and aryl type groups. The fluorocarbon group can include one or more positions of the alkyl or aryl group substituted with a fluorine group. Where more than one hydrogen atom has been replaced with a fluorine group, the resultant moiety is perfluorinated. Suitable examples of perfluorinated alkyls are those that include two methylenes ($CH_2$) groups adjacent to the Si moiety (the remainder of the alkyl chain being perfluorinated) or fully fluorinated.

The term "reactive group" of a silane is intended to mean those moieties that will react with a component of the MEMS device surface, such as a hydroxyl group or an oxide layer. Suitable reactive groups include, for example, halogen atoms (chloride, fluoride, iodide, bromide), hydride (H) and OR', wherein OR' is defined below.

There are two types of silane groups selected for the composite coating: those that selectively attach to the solid surface of interest and those that attach to each other for cross-linking as well as to the surface. An example for the first type of molecules is 1H,1H,2H,2H-perfluorooctyl dimethyl methoxysilane, i.e., $CF_3(CF_2)_5CH_2CH_2Si(CH_3)_2OCH_3$. An example for the second type of precursor molecule is 1H,1H,2H,2H-perfluorooctyl trimethoxysilane, i.e., $CF_3(CF_2)_5CH_2CH_2Si(OCH_3)_3$. Both types include a perfluorinated group.

In particular, the silane groups that provide low surface energy are those, which contain straight chain alkyl groups, which are capable of forming a close-packed monolayer where each alkyl group is in van der Waals contacts with neighboring alkyl groups. These straight chain alkyl groups can be of any length desired for the particular application and are, in particular, fully fluorinated or partially fluorinated with $CF_3$ termination.

The present invention provides anti-stiction and passivation coatings for MEMS devices, in part, because the coating is sufficiently thin, particularly on the order of a few nanometers and more specifically a monolayer. A monolayer corresponds to a closely packed molecular film with thickness no more than one of the dimensions (typically the length) of the film forming molecule. Such nanometer thickness ensures that the presence of the coating does not appreciably affect the mechanical properties of the MEMS structure and does not result in electrostatic charging within the organic coating. Surprisingly, there have been no demonstrations of covalently bonded organic coatings with nanometer scale thickness that can survive the large number ($>10^9$) of mechanical contacts required for some MEMS devices until the present methods and coatings provided by this invention.

In contrast to the present invention, siloxane self-assembled monolayers (SAMs) formed from alkyltrichlorosilane or alkyltrialkoxylsilanes as passivation coatings for MEMS, fail as anti-stiction coatings after repeated contacts, particularly in the presence of high humidity. Not to be limited by theory, it is believed that the mechanism of SAM formation from alkyltrichlorosilane or alkyltrialkoxylsilanes proceeds by the initial conversion of Si—X (X=Cl, or —OR, where R is a methyl or ethyl group) groups on the silane molecule to Si—OH groups. Under ideal conditions, a Langmuir like monolayer is formed on the hydrophilic surface with the presence of a thin water film. A cross-linked surface assembly is then formed by condensation reactions between the —OH groups on the silane molecules with those on the oxide surface or on neighboring silanes. Complications arise because close-packing of alkyl groups is incompatible with cross-linking between neighboring Si—OH groups within the monolayer and there is competition between cross linking and surface attachment. As a result, the siloxane SAM may consist of extensively cross-linked molecules, but with few covalent bonds to the surface. Such a monolayer is poorly attached to the substrate surface and, under repeated mechanical contacts, may roll-up and form clumps on the surface. This is a generally accepted mechanism for the failure of anti-stiction properties. The availability of three reactive groups on each silane molecule also leads to the easy formation of polymeric and other microstructures that are not desirable for MEMS devices. The present invention circumvents many of these issues.

Digital mirror devices (DMDs) require stringent application, where components on a MEMS structure come into frequent contact, e.g., tens or hundreds of billion ($10^{10-11}$) cycles during the lifetime of the device. It is of critical importance that the organic passivation coating not only provides low surface energy, but also possesses sufficient mechanical stability to survive the large number of contacts. The present invention affords such protection. In contrast, a method currently employed in DMD production is to form a low energy coating involving an oriented monolayer that includes —COOH and —$CF_3$ end groups, e.g., a perfluorodecanoic acid (PFDA) molecule, attached to the surface of a MEMS device during the packaging stage. An excess amount of these molecules is added to the package to provide a background pressure of PFDA; the reversible adsorption/desorption of these molecules from the surfaces provides a self-repair mechanism, thus allowing the operation of the device for $10^{11}$ cycles without stiction failure. However, due to the weak bonding between the —COOH group and the surface, the monolayer is susceptible to moisture attack, thermal decomposition, and evaporation. These necessitate the use of hermetically sealed packages and relatively low operating temperatures. The perfluorodecanoic acid molecule is also corrosive towards some materials commonly used in MEMS devices. Thus, the use of such compounds during the packaging process to coat the surfaces is undesirable for some MEMS products. Advantageously, the present invention circumvents many of the disadvantages of the current known methods and coatings.

In one embodiment, the present invention provides methods of applying a coating to the surface of a MEMS device that includes a first step of contacting the surface of the MEMS device with a silane of the formula $SiX_3R$. The silane can be applied to the surface as a gas, a liquid, or in solution.

In a second step, the coated surface is then heated at an elevated temperature. This method provides improved anti-stiction properties to the coated surface. In one aspect, a thin film can be formed on the surface of the MEMS device. In another aspect, a self-assembled monolayer (SAM) can be formed on the surface of the MEMS device as described below.

For $SiX_3R$, R is a linear or branched, substituted or unsubstituted alkyl or aryl group and each X, independently, is a halogen atom, hydrogen, or OR'. R' is a linear or branched, substituted or unsubstituted alkyl or aryl group. A suitable example of $SiX_3R$ is 1H,1H,2H,2H-perfluorooctyl trimethoxysilane (PFOTMS), i.e., $CF_3(CF_2)_5CH_2CH_2Si(OCH_3)_3$.

The temperature of the reaction in the first step is one that can be appropriate for the formation of a self-assembled monolayer on the surface of the MEMS device(s). The temperature of this reaction is generally from about 0° C. to about 40° C., and more particularly from about 10° C. to about 25° C. The partial pressure of the silane at the reaction temperature is at least about $1\times10^{-6}$ atmospheres (atm), and more particularly at least about $1\times10^{-3}$ atm.

This process is known to be able to form a self-assembled monolayer (SAM) of $RSi(OH)_3$, with limited number of intermolecular cross-linking (Si—O—Si) or bonding to the surface (—Si—O-Surface) (see., e.g., A. Y. Fadeev, T. J. McCarthy, *Langmuir* 2000, 16, 7266–7274; J. Genzer, K. Efimenko, D. A. Fischer, *Langmuir* 2002, 19, 9307–9311). The SAM usually forms via an island growth mechanism, leading to incomplete monolayers with patchy structures and a large number of vacancies (see, e.g., J. Y. Huang et al. *Langmuir* 1997, 13, 58; D. H. Flinn, D. A. Guzonas, R.-H. Yoon, *Colloids Surf.* 1994, 87, 163; R. Banga, et al. *Langmuir* 1997, 13, 58; A. G. Richer et al. *Langmuir* 1998, 14, 5980; C. Carraro, O. W. Yauw, M. M. Sung, R. Maboudian, *J. Phys. Chem.* 1998, 102, 4441).

Alternatively, the temperature of the reaction in the first step is one that can be appropriate for the formation of a thin film on the surface of the MEMS device(s). The temperature of this reaction is generally from about 0° C. to about 300° C. The partial pressure of the silane at the reaction temperature is at least about $1\times10^{-6}$ atmospheres (atm), and more particularly at least about $1\times10^{-3}$ atm. For some R groups, such as alkyls shorter than n-decyl, this process is known to be able to form oligomeric siloxane thin films on the surface (see., e.g., A. Y. Fadeev, T. J. McCarthy, *Langmuir* 2000, 16, 7266–7274).

The temperature of the second step is generally from about 50° C. to about 350° C., more particularly from about 80° C. to about 250° C., and even more specifically from about 100° C. to about 200° C., e.g. about 150° C. The pressure of the silane at the reaction temperature is generally at least about $1\times10^{-6}$ atmospheres (atm), more particularly at least about $1\times10^{-3}$ atm, even more specifically about 1 atm.

The afore-mentioned methods with $SiX_3R$ can further include in the second step, the heating step, an environment that contains at least one compound having the formula $SiXR''_3$. Each R'', independently, is a linear or branched, substituted or unsubstituted alkyl or aryl group and X is a halogen atom, H, or OR'. R' is as defined above. A suitable example of $SiXR''_3$ is 1H,1H,2H,2H-perfluorooctyl dimethyl methoxysilane (PFODMMS), $CF_3(CF_2)_5CH_2CH_2Si(CH_3)_2OCH_3$. The silane can be added as a gas, a liquid, or in solution.

Contact of the surface of the above siloxane coated MEMS device at elevated temperatures with one or more compounds of the formula $SiXR''_3$ provides extensive cross-linking (Si—O—Si) and bonding to the surface (—Si—O-Surface) within islands of the siloxane oligomers. SiXR"3 reacts with surface vacancy sites to form surface anchored $R''_3Si$—O-surface species. SiXR"3 also reacts with unreacted Si—OH groups within islands of oligomeric siloxane.

The result of the two steps described above for SAMs (treated with both $SiX_3R$ and $SiXR''_3$) is a composite monolayer, illustrated in FIG. 1, consisting of two types of regions: (A) cross-linked regions with a small number of anchoring bonds to the surface, and (B) strongly anchored regions where each molecule is individually bonded to the surface. The composite nature of the monolayer provides much enhanced mechanical stability, as compared to coatings of pure (A) or (B).

Alternatively, the result of the two steps described above for a thin film (treated with both $SiX_3R$ and $SiXR''_3$) is a thin film composite coating consisting of regions of oligomeric siloxane from $SiX_3R$ and regions of $R''_3Si$—O— bonded to the surface or oligomeric siloxane.

In another embodiment, the present invention provides methods of applying a coating to the surface of a MEMS device that includes a first step of contacting the surface of the MEMS device with a silane of the formula $SiX_2R_2$. The silane can be applied to the surface as a gas, a liquid, or in solution.

In a second step, the coated surface is then heated at an elevated temperature. This method provides improved anti-stiction properties to the coated surface. In one aspect, a thin film can be formed on the surface of the MEMS device. In another aspect, a self-assembled monolayer (SAM) can be formed on the surface of the MEMS device as described below.

For $SiX_2R_2$, each R, independently, is a linear or branched, substituted or unsubstituted alkyl or aryl group and each X, independently, is a halogen atom, hydrogen, or OR'. R' is a linear or branched, substituted or unsubstituted alkyl or aryl group.

The temperature of the reaction in the first step is one that can be appropriate for the formation of a self-assembled monolayer on the surface of the MEMS device(s). The temperature of this reaction is generally from about 0° C. to about 40° C., and more particularly from about 10° C. to about 25° C. The partial pressure of the silane at the reaction temperature is at least about $1\times10^{-6}$ atmospheres (atm), and more particularly at least about $1\times10^{-3}$ atm.

This process, as described above, is known to be able to form a self-assembled monolayer (SAM) of $RSi(OH)_3$, with limited number of intermolecular cross-linking (Si—O—Si) or bonding to the surface (—Si—O-Surface) (see., e.g., A. Y. Fadeev, T. J. McCarthy, *Langmuir* 2000, 16, 7266–7274; J. Genzer, K. Efimenko, D. A. Fischer, *Langmuir* 2002, 19, 9307–9311). The SAM usually forms via an island growth mechanism, leading to incomplete monolayers with patchy structures and a large number of vacancies (see, e.g., J. Y. Huang et al. *Langmuir* 1997, 13, 58; D. H. Flinn, D. A. Guzonas, R.-H. Yoon, *Colloids Surf.* 1994, 87, 163; R. Banga, et al. *Langmuir* 1997, 13, 58; A. G. Richer et al. *Langmuir* 1998, 14, 5980; C. Carraro, O. W. Yauw, M. M. Sung, R. Maboudian, *J. Phys. Chem.* 1998, 102, 4441).

Alternatively, the temperature of the reaction in the first step is one that can be appropriate for the formation of a thin film on the surface of the MEMS device(s). The temperature of this reaction is generally from about 0° C. to about 300° C. The partial pressure of the silane at the reaction temperature is at least about $1\times10^{-6}$ atmospheres (atm), and more particularly at least about $1\times10^{-3}$ atm. For some R groups, such as alkyls shorter than n-decyl, this process is known to be able to form oligomeric siloxane thin films on the surface (see., e.g., A. Y. Fadeev, T. J. McCarthy, *Langmuir* 2000, 16, 7266–7274).

The temperature of second step is generally from about 50° C. to about 350° C., more particularly from about 80° C.

to about 250° C., and even more specifically from about 100° C. to about 200° C., e.g. about 150° C. The pressure of the silane at the reaction temperature is generally at least about $1\times10^{-6}$ atmospheres (atm), more particularly at least about $1\times10^{-3}$ atm, even more specifically about 1 atm.

The afore-mentioned methods with $SiX_2R_2$ can further include in the second step, the heating step, an environment that contains at least one compound having the formula $SiXR''_3$. Each R", independently, is a linear or branched, substituted or unsubstituted alkyl or aryl group and X is a halogen atom, H, or OR'. R' is as defined above. A suitable example of $SiXR''_3$ is 1H,1H,2H,2H-perfluorooctyl dimethyl methoxysilane (PFODMMS), $CF_3(CF_2)_5CH_2CH_2Si(CH_3)_2OCH_3$. The silane can be added as a gas, a liquid, or in solution.

Contact of the surface of the above siloxane coated MEMS device at elevated temperatures with one or more compounds of the formula $SiXR''_3$ provides extensive cross-linking (Si—O—Si) and bonding to the surface (—Si—O—Surface) within islands of the siloxane oligomers. $SiXR''3$ reacts with surface vacancy sites to form surface anchored $R''_3Si$—O-surface species. $SiXR''3$ also reacts with un-reacted Si—OH groups within islands of oligomeric siloxane.

The result of the two steps described above for SAMs (treated with both $SiX_2R_2$ and $SiXR''_3$) is a composite monolayer, illustrated in FIG. 1, consisting of two types of regions: (A) cross-linked regions with a small number of anchoring bonds to the surface, and (B) strongly anchored regions where each molecule is individually bonded to the surface. The composite nature of the monolayer provides much enhanced mechanical stability, as compared to coatings of pure (A) or (B).

Alternatively, the result of the two steps described above for a thin film (treated with both $SiX_2R_2$ and $SiXR''_3$) is a thin film composite coating consisting of regions of oligomeric siloxane from $SiX_3R$ and regions of $R''_3Si$—O— bonded to the surface or oligomeric siloxane.

In still another embodiment, the present invention provides methods of applying a coating to the surface of a MEMS device that includes a first step of contacting the surface of the MEMS device with a combination of silanes having the formulae $SiX_3R$ and $SiX_2R_2$, wherein $SiX_3R$ and $SiX_2R_2$ are as defined above. The silanes can be applied to the surface in a gaseous state, as a liquid, or in solution.

In a second step, the coated surface is then heated at an elevated temperature. This method provides improved anti-stiction properties to the coated surface. In one aspect, a thin film can be formed on the surface of the MEMS device. In another aspect, a self-assembled monolayer (SAM) can be formed on the surface of the MEMS device as described below.

The temperature of the reaction in the first step is one that can be appropriate for the formation of a self-assembled monolayer on the surface of the MEMS device(s) as described above. The temperature of this reaction is generally from about 0° C. to about 40° C., and more particularly from about 10° C. to about 25° C. The partial pressure of the silane at the reaction temperature is at least about $1\times10^{-6}$ atmospheres (atm), and more particularly at least about $1\times10^{-3}$ atm.

Alternatively, the temperature of the reaction in the first step is one that can be appropriate for the formation of a thin film on the surface of the MEMS device(s) as described above. The temperature of this reaction is generally from about 0° C. to about 300° C. The partial pressure of the silanes at the reaction temperature is at least about $1\times10^{-6}$ atmospheres (atm), and more particularly at least about $1\times10^{-3}$ atm.

The temperature of second step is generally from about 50° C. to about 350° C., more particularly from about 80° C. to about 250° C., and even more specifically from about 100° C. to about 200° C., e.g. about 150° C. The pressure of the silanes at the reaction temperature is generally at least about $1\times10^{-6}$ atmospheres (atm), more particularly at least about $1\times10^{-3}$ atm, even more specifically about 1 atm.

The afore-mentioned methods with $SiX_3R$ and $SiX_2R_2$ can further include in the second step, the heating step, an environment that contains at least one compound having the formula $SiXR''_3$, wherein $SiXR''_3$ is as described above. A suitable example of $SiXR''_3$ is 1H,1H,2H,2H-perfluorooctyl dimethyl methoxysilane (PFODMMS), $CF_3(CF_2)_5CH_2CH_2Si(CH_3)_2OCH_3$. The silane can be added as a gas, a liquid, or in solution.

Contact of the surface of the above siloxane coated MEMS device at elevated temperatures with one or more compounds of the formula $SiXR''_3$ provides extensive cross-linking (Si—O—Si) and bonding to the surface (—Si—O—Surface) within islands of the siloxane oligomers. $SiXR''3$ reacts with surface vacancy sites to form surface anchored $R''_3Si$—O-surface species. $SiXR''3$ also reacts with un-reacted Si—OH groups within islands of oligomeric siloxane.

The result of the two steps described above for SAMs (treated with both $SiX_3R$ and $SiX_2R_2$ and $SiXR''_3$) is a composite monolayer, illustrated in FIG. 1, consisting of two types of regions: (A) cross-linked regions with a small number of anchoring bonds to the surface, and (B) strongly anchored regions where each molecule is individually bonded to the surface. The composite nature of the monolayer provides much enhanced mechanical stability, as compared to coatings of pure (A) or (B).

Alternatively, the result of the two steps described above for a thin film (treated with both $SiXR_3$ and $SiX_2R_2$ and $SiXR''_3$) is a thin film composite coating consisting of regions of oligomeric siloxane from $SiX_3R$ and regions of $R''_3Si$—O— bonded to the surface or oligomeric siloxane.

When a silane solution is utilized in any of the above-identified methods, the concentration of the silane in the solution is generally at least about $1\times10^{-6}$ mole/l (M), more particularly from about $1\times10^{-4}$ M to about $1\times10^{-2}$ M. Alternatively, the silane can be applied in the absence of a solvent.

Suitable solvents to prepare the solution include, for example, iso-octane, hexadecane, THF, DMSO, and alcohols.

Heating of the treated surfaces in the second step for any of the above methods, can be conducted under, vacuum, under an inert gas environment (argon or nitrogen, for example) or in air.

In certain embodiments, R' can be a linear alkyl group, such as methyl or ethyl.

In certain embodiments R can be a perfluorinated alkyl group, having a carbon chain length of about 6 to about 12 carbon atoms. In certain embodiments, one "terminal" portion of the perfluorinated alkyl group remains unfluorinated, such that two unfluorinated methylenes exist (e.g., 1H,1H,2H,2H-perfluoroalkyl). The unfluorinated methylene chain is generally attached to the Si of the reactive moiety. For example, 1H,1H,2H,2H-perfluorooctane is a suitable R group.

In certain embodiments of the invention, R" can be a perfluorinated alkyl group, having a carbon chain length of about 6 to about 12 carbon atoms. In certain embodiments, one "terminal" portion of the perfluorinated alkyl group remains unfluorinated, such that two unfluorinated methylenes exist (e.g., 1H,1H,2H, 2H-perfluoroalkyl). The unfluorinated methylene chain is generally attached to the Si of the reactive moiety. For example, 1H,1H,2H,2H-perfluorooctyl dimethyl methoxysilane (PFODMMS), $CF_3(CF_2)_5$ $CH_2CH_2Si(CH_3)_2OCH_3$ is a suitable example where R" is 1H,1H,2H,2H-perfluorooctyl.

In a particular embodiment, a microelectromechanical system is formed that includes the surface of the present invention. There are many types of MEMS devices. They can include, for example, optical routing devices, digital mirror devices, microvalves, pressure sensors, and the like. Examples of MEMS devices are disclosed in U.S. Pat. No. 5,694,740 (Martin et al.) and U.S. Pat. No. 5,602,671 (Hornbeck) and can generically found in Proceeding of the 7$^{th}$ International Conference on the Commercialization of Micro and Nano Systems; Hsu, Tai-Ran—MEMS and Microsystems: design and manufacture (McGraw-Hill, 2002.); and W. Menz, J. Mohr, O. Paul, Microsystem technology (Wiley-VCH, New York, 2001).

EXPERIMENTALS

Si(111) samples were slices of polished Si(111) wafers (Wafernet). They were cleaned in oxygen plasma (250 mtorr $O_2$, 200 watts, 2 min.). Immediately after plasma cleaning, each sample was placed in a clean plastic box (Fluoroware). One drop (3.5 microlieter liquid) of 1H,1H,2H,2H-perfluorooctyl triethoxysilane (PFOTES) was added into the box (not touching the sample). Each box was sealed at room temperature (20° C.) and ambient pressure (760 torr) and the Si samples were coated by PFOTES vapor. After three hours, the box was opened and the samples were removed from the plastic box for further processing or testing. This vapor exposure leads to the formation of a self-assembled monolayer of PFOTES on Si(111) and each was referred to as A/Si(111).

To form the composite coating, the A/Si(111) samples were placed in a stainless steel reactor (a 2 inch diameter tube with NW40 flanges on both ends) with approximate volume of 300 ml. A drop (10 microliter, liquid) of 1H,1H, 2H,2H-perfluorooctyl dimethyl ethoxysilane (PFODMES) was added to the reactor (not touching the sample) at room temperature and ambient pressure. The reactor was subsequently sealed and placed in an oven set at 125° C. After ~12 hours, the reactor was removed from the oven and opened immediately. The samples were removed from the reactor for further testing. This process lead to the composite monolayer on Si(111) and each sample was referred to as AB/Si(111).

Table 1 lists the values of water contact angle on the three surfaces: AB/Si(111), A/Si(111), B/Si(111). The AB/Si(111) surface shows the highest value of static water contact angle (qs) and the lowest value of hysteresis between advancing and receding water contact angles (qa-qr). Both results indicated that, among the three surfaces, the one with composite coating gave the most complete coverage of surface attached 1H,1H,2H,2H-perfluorooctyl groups with —$CF_3$ termination.

TABLE 1

Water contact angles in degrees. Error: ±2°
$\theta_s$: static; $\theta_a$: advancing; $\theta_r$: receding

| Sample | $\theta_s$: Static | $\theta_a$: Advancing | $\theta_r$: Receding |
|---|---|---|---|
| AB/Si(111) | 120° | 125° | 110° |
| A/Si(111) | 115° | 125° | 95° |
| B/Si(111) | 100° | 110° | 90° |

Quantitative comparisons between these surfaces are shown by interfacial force microscopy measurements. This technique allows the direct measurement of adhesion and friction forces between a probe tip and a solid surface on the microscopic scale. In each measurement, both the normal force (FN) and the friction force (FR) are zero when the tip is at long distance from the surface. As the tip moves closer to the surface, FN becomes negative, indicating attractive interaction between the tip and the surface. The absolute value of FN when it is minimum corresponds to the adhesion force, FA. As the tip moves further towards the surface, the normal force rises rapidly, indicting repulsion between the tip and the solid substrate. The simultaneously measured friction force rises when the tip and the surface interacts, particularly in the repulsive region.

Figure 2:
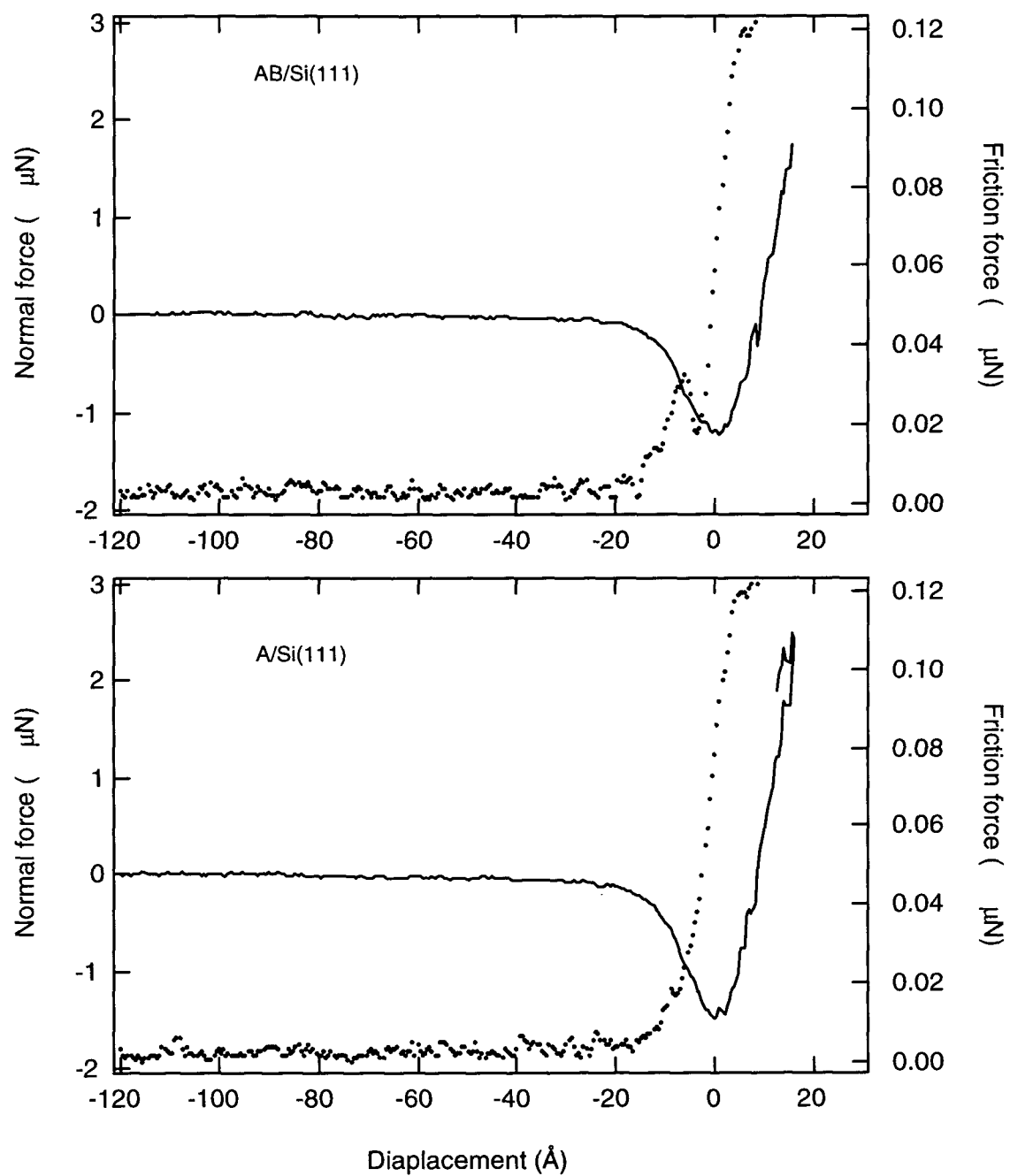
FIG. 2 compares tribological results between a composite monolayer prepared from 1H,1H,2H,2H-perfluorooctyl tri-ethoxysilane (PFOTES) and 1H,1H,2H,2H-perfluorooctyl dimethyl methoxysilane (PFODMES) on a Si(111) surface and a one-component monolayer prepared from PFOTES on Si(111). The composite monolayer is labeled AB/Si(111) (upper panel) and the PFOTES monolayer as A/Si(111) (lower panel). The measurements were carried out on an Interfacial Force Microscope (IFM) at Sandia National Laboratory, with a gold coated tungsten tip of ~5 micrometer diameter. The lines are normal force (in $\mu$N) and the dots are frictional force ($\mu$N, uncalibrated). The x-axis is tip-surface distance (d). The zero value is the equilibrium position when the normal force is most negative (adhesion force). The d<0 value corresponds to attractive region and the d>0 value corresponds to repulsive region.

FIG. 2 compares the composite AB/Si(111) surface with the A/Si(111) surface. These experiments were done with the same tip, thus allowing a direct, quantitative comparison. Compared to the AB/Si(111) surface, the A/Si(111) shows 25% more surface adhesion force, in agreement with water contact angle measurements in Table 1. Thus, the AB/Si (111) is more completely covered by 1H,1H,2H,2H-perfluorooctyl groups with —$CF_3$ termination to give a lower surface adhesion force. The A/Si(111) surface also shows similar increase in friction force. It is known from previous IFM studies (see, e.g., Major, R. C.; Kim, H. I.; Houston, J. E.; Zhu, X.-Y. Tribol. Lett. 2003, 14, 237–244. Houston, J. E.; Kim, H. I. Acct. Chem. Res, 2002, 35, 547–553.) that the friction force is sensitive to the presence of disorder, such as vacancies and domain boundaries, in a monolayer film. Thus, it appears that less defects are within the composite AB/Si(111) monolayer than those in the single component A/Si(111) monolayer. Defects within the film are believed to be the origins of film degradation.

Figure 3:
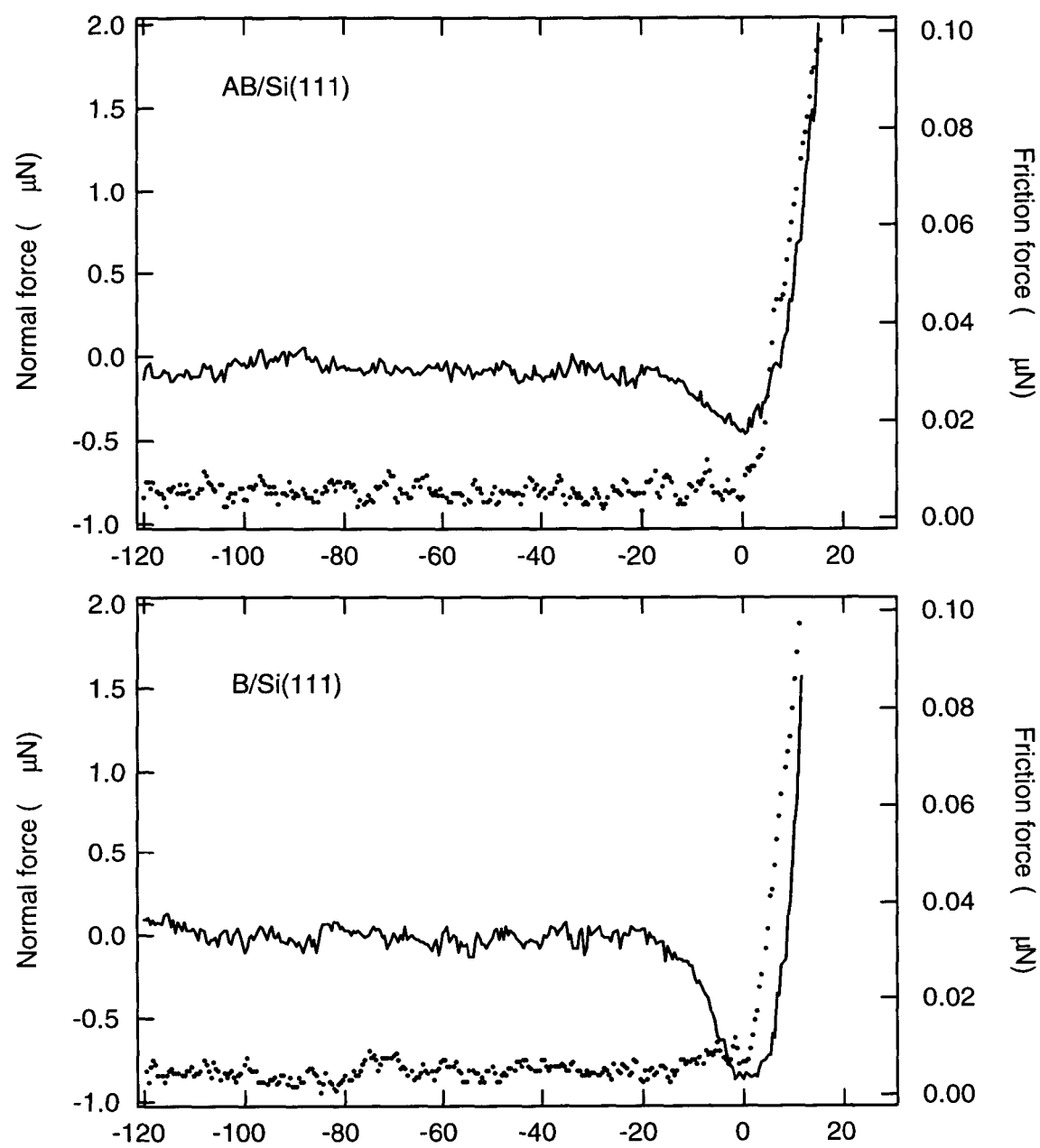
FIG. 3 compares tribological results between a composite monolayer prepared from 1H,1H,2H,2H-perfluorooctyl tri-ethoxysilane (PFOTES) and 1H,1H,2H,2H-perfluorooctyl dimethyl methoxysilane (PFODMES) on a Si(111) surface and a one-component monolayer prepared from PFODMES on Si(111). The composite monolayer is labeled AB/Si(111) (upper panel) and the PFODMES monolayer as B/Si(111) (lower panel). The measurements were carried out on an Interfacial Force Microscope (IFM) at Sandia National Laboratory, with tungsten tip of ~3.8 micrometer diameter. The lines are normal force (in mN) and the dots are frictional force ($\mu$N, uncalibrated).

FIG. 3 compares the composite AB/Si(111) surface with the B/Si(111) surface. These experiments were done with the same tip, but different from the tip used in FIG. 2. Compared to the AB/Si(111) surface, the B/Si(111) shows 80% more surface adhesion force. Thus, the surface coverage of —$CF_3$ terminal groups decreases in the order of AB/Si(111)>A/Si (111)>B/Si(111). The B/Si(111) surface also shows much higher friction force than that on AB/Si(111).

Although the present invention has been described with reference to preferred embodiments, persons skilled in the art will recognize that changes may be made in form and detail without departing from the spirit and scope of the invention. The teachings of any reference cited throughout this specification are incorporated herein in their entirety.

I claim:

1. A method of applying a coating to the surface of a MEMS device comprising the steps of:
    a first step of contacting the surface of the MEMS device with a silane of the formula $SiX_3R$, wherein R is a linear or branched, substituted or unsubstituted alkyl or aryl group and each X, independently, is an OR', wherein R' is a linear or branched, substituted or unsubstituted alkyl or aryl group, thereby forming a coating on the surface of the MEMS device wherein $SiX_3R$ is $CF_3(CF_2)_5CH_2CH_2Si(OCH_3)_3$; and a second step of heating the treated MEMS device at a temperature from about 50° C. to about 350° C., wherein during heating of the treated MEMS device, the method further comprises contacting the treated MEMS device with at least one compound having the formula $SiXR''_3$, wherein each R'', independently, is a linear or branched, substituted or unsubstituted alkyl or aryl group and X is a halogen atom, H, or OR', wherein R' is a linear or branched, substituted or unsubstituted alkyl or aryl group wherein $SiXR''_3$ is $CF_3(CF_2)_5CH_2CH_2Si(CH_3)_2OCH_3$.

2. The method of claim 1, wherein the silane is in a gaseous state.

3. The method of claim 1, wherein the silane is applied as a solution.

4. The method of claim 1, wherein the contacting temperature of the first step is from about 0° C. to about 40° C. and the heating temperature of the second step is from about 50° C. and 350° C.

5. The method of claim 1, wherein the contacting temperature of the first step is from about 10° C. to about 25° C.

6. The method of claim 1, wherein the heating temperature of the second step is from about 80° C. to about 250° C.

7. The method of claim 1, wherein the coating is a monolayer film.

8. The method of claim 1, wherein the coating is a thin film of at least a nanometer in thickness.

* * * * *